July 13, 1954 G. W. FYLER 2,683,776

AMPLIFIER

Filed Dec. 15, 1951 2 Sheets-Sheet 1

INVENTOR.
George W. Fyler
BY Norman L. Mueller
Atty.

July 13, 1954 G. W. FYLER 2,683,776

AMPLIFIER

Filed Dec. 15, 1951 2 Sheets-Sheet 2

INVENTOR.

George W. Fyler

BY

Norman L. Mueller

Atty.

Patented July 13, 1954

2,683,776

UNITED STATES PATENT OFFICE 2,683,776

AMPLIFIER

George W. Fyler, Lombard, Ill., assignor to Motorola, Inc., Chicago, Ill., a corporation of Illinois Application December 15, 1951, Serial No. 261,887

8 Claims. (Cl. 179—171)

The present invention relates to radio frequency amplifiers, and more particularly to improvements in radio frequency amplifiers particularly intended for use in television receivers.

The principles of regenerative feedback as applied to radio frequency amplifiers are well known. Before the almost universal adoption of the superheterodyne receiver circuit, regenerative feedback was used in radio receivers of the tuned radio frequency type to increase their selectivity and gain. More recently, radio frequency amplifiers have been used as preselectors in the tuner circuits of superheterodyne type television receivers to minimize oscillator radiation and to amplify the signal before applying it to the superheterodyne mixer stage.

The television frequency bands include a so-called "high band" in the very high frequency range of 174 to 216 megacycles. In addition, present developments will require television tuner operation at even higher frequencies. The grid input loading resistance of a pentrode RF amplifier tube decreases inversely as the square of the frequency. This decreases the gain and increases the bandwidth leading to a poor noise factor. This limitation generally does not occur below 100 megacycles in wide bandwidth circuits used in television and a damping resistor must be used to obtain sufficient bandwith.

It is an object of the present invention to provide an improved radio frequency amplifier having increased gain and selectivity in very high frequency ranges including the television "high band."

Another object of the present invention is to provide an improved tuned radio frequency amplifier for use as a preselector in a superheterodyne type of television tuner that is tunable through a range of frequency above 100 megacycles, and which has improved sensitivity to thereby increase the signal to noise ratio of the signal applied to the mixer stage of the television tuner.

Another object of the invention is to provide means to compensate for the degenerative input loading of radio frequency amplifier tube operating at very high frequencies in a manner to obtain high gain and a desired bandwidth such as may be useful in television circuits or the like.

A feature of the invention is the provision of regenerative feedback between the plate circuit and the control grid circuit of a tuned radio frequency amplifier tube, advantage being taken of the stray reactance of the grounding leads of the plate circuit elements to provide the desired regenerative coupling.

Another feature of the invention is the manner of interconnecting coupling coils and bypass elements of a very high frequency radio amplifier to a chassis ground in such a way as to provide a predetermined amount of regenerative feedback and thereby increase the gain and selectivity of the amplifier.

Yet another feature of the present invention as applied to the "high band" circuit of the so-called "switch tuned" type of television tuner, is the connection of a bypass condenser for the tuned plate circuit of the radio frequency amplifier tube to chassis ground through an electrically conductive spacer member of the gang switch of the tuner. A "high band" input coupling circuit for the grid electrode of the radio frequency amplifier tube is also connected through the spacer member to chassis ground, so that reactive coupling is obtained between the grid and plate electrodes of the amplifier tube to provide regenerative feedback and increase the gain and reduce the bandwidth in the "high band" response.

Further objects, features and advantages of the present invention will be apparent with reference to the following specification and drawings in which.

In practicing the invention, a switch tuned type of superheterodyne television tuner is provided with a preselector or radio frequency amplifier tube having control grid and plate electrodes. Tuned circuits for different selected frequency ranges are switchable by a gang switch to be connected respectively to the control grid and plate electrodes of the preselector tube. A chassis ground for the entire tuner circuit is used. The tuned plate circuits are provided with a bypass or decoupling condenser for returning the radio frequencies to ground. The decoupling condenser is connected to a spacer member of the gang switch. The spacer member, which is of electrically conductive material, is connected directly to the chassis ground at one end and at the other end through a grounding lead. One end of an input coupling circuit for the tuned grid circuits in the selected frequency ranges which may be above 100 megacycles is also returned to ground through a connection to the spacer member at a point near the connection of the spacer member directly to the chassis ground but remote from the connection of the bypass condenser. The spacer member itself and the ground lead connection from the spacer member to ground, have an appreciable reactance to radio frequency signals above 100 megacycles and in view of the above described connections, the bypass condenser and the input coupling circuit are thereby interconnected or coupled together. In such manner regenerative feedback between the plate and grid electrodes of the preselector radio frequency amplifier tube is obtained for operation at frequencies higher than 100 megacycles with consequent improvements in sensitivity and selectivity of the tuner.

Figure 1:
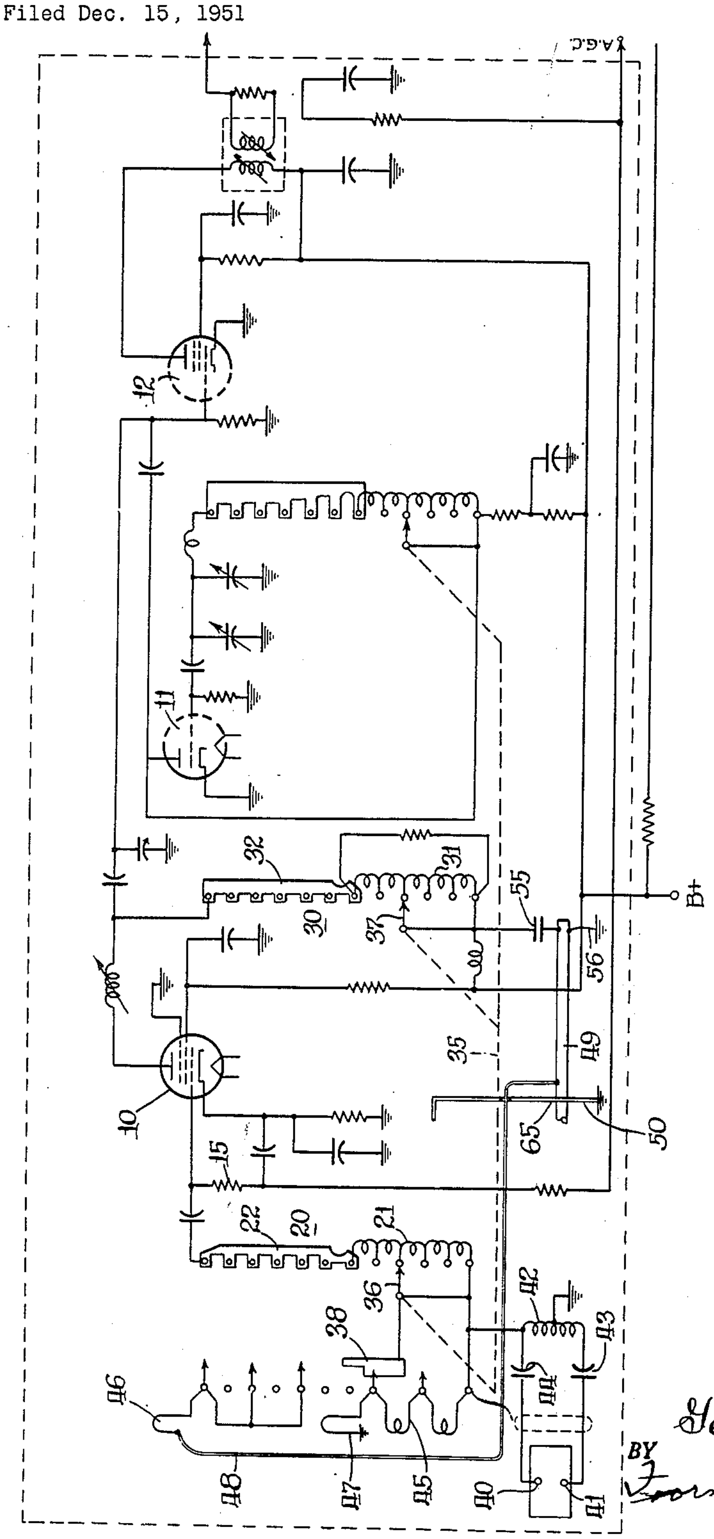
Fig. 1 is a schematic circuit of the television tuner and diagrammatically showing the reactive coupling connections of the invention.
Figures 2, 3, 4, 5:
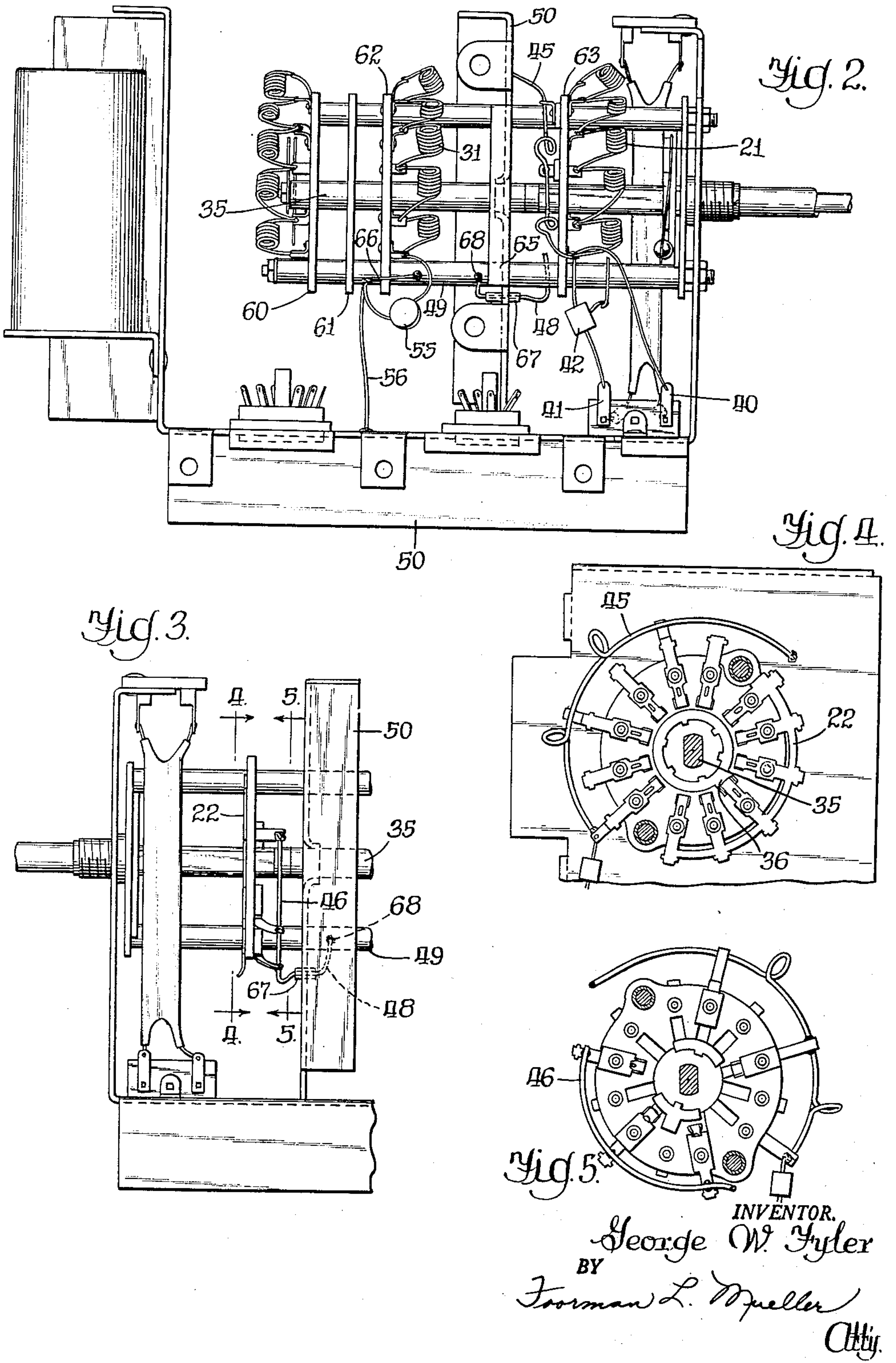
Fig. 2 is a side view of the television tuner chassis.
Fig. 3 is a fragmentary side view of the television tuner chassis as seen from the opposite side shown in Fig. 2.
Fig. 4 is a cross section taken in a direction of the arrows on line 4—4 of Fig. 3.
Fig. 5 is a cross section taken in the direction of the arrows on the line 5—5 of Fig. 3.

Fig. 1 is a schematic diagram of a "switch tuned" superheterodyne television tuner embodying the invention. The tuner includes the radio frequency amplifier or preselector tube 10, the oscillator tube 11 and the mixer tube 12. Most of the circuit details of the television tuner shown in Fig. 1 of the drawings are conventional and will not be further described except as they may relate to the invention. The preselector tube 10 is provided with a tuned grid circuit including selected ones of the series of coils generally shown at 20 and comprising a low band series of coils 21 tunable in the range of frequencies of 54 to 88 megacycles and a "high band" series of coils 22 tunable in the range of frequencies of 174 to 216 megacycles. A grid circuit loading resistor 15 is provided in order to obtain a desired bandwidth for the lower frequency channels. The plate circuit of the preselector tube 10 is also provided with a tuned circuit generally indicated at 30 and comprising a first series of coils 31 tunable in the range of frequencies of 54 to 88 megacycles, and a second series of coils 32 tunable in the range of frequencies of 174 to 216 megacycles. The selection of frequencies to which the tuned grid and plate circuits of the preselector tube may be tuned is obtained by means of the gang switch 35 which is rotatable to move the switch contacts 36 and 37 to selected taps on the series of coils generally shown at 20 and 30. The input signal for the tuner is applied to the antenna terminals 40 and 41. The antenna terminals are connected by the transformer 42 and condensers 43 and 44 to an input coupling circuit including the coupling coil 45 for the "low band" coils 21 and the coupling coils 46 for the "high band" coils 22. One end of the coupling coil 45 for the "low band" coils is directly connected to chassis ground at 47. On the other hand, one end or the coupling coil 46 for the "high band" coils 22 is connected to chassis ground 50 through the lead 48 and the conducting member 49. The other ends of the coupling coils 46 and 47 are selectively switched into the circuit by the switch contact 38 which is gang connected with switch contacts 36 and 37 as should be readily understood. The conducting member 49 is a metallic spacer element used to space the wafer switch sections of a conventional rotary gang switch such as used in the tuner chassis for switching the various resonant circuits of the tuner.

The tuned plate circuit 30 of the preselector tube 10 is provided with a condenser 55 which in the known circuit is connected to chassis ground, bypassing the power supply and providing a ground return path for the radio frequencies. According to the present invention, however, the normally grounded end of the bypass condenser 55 for the plate circuit of the preselector tube 10 is connected to the conducting spacer member 49 which in turn is connected to chassis ground either at 50 or through the grounding lead 56. The grounding lead 56 and all portions of the conducting spacer member 49 that are spaced from the chassis ground 50 have an appreciable reactance to radio frequency signals of 100 megacycles or higher. Inasmuch as the input coupling coil 46 for the tuned grid circuits resonating in a frequency range of 174 to 216 megacycles is returned to ground through the spacer bar 49 as is also true of the bypass condenser 55 for the tuned plate circuit, it will be apparent that regenerative feedback is obtained between the plate and grid electrodes of the preselector tube 10 for the range of frequencies of 174 to 216 megacycles. By varying the points of connection of the input coupling coil grounding lead 48 or the point of connection of the bypass condenser 55 along the spacer bar 49 the amount of regenerative feedback may be predetermined. Similarly the length of the grounding lead 56 and its diameter may also be varied to vary its reactance and hence the amount of regenerative feedback.

The structural features of the invention are shown most clearly in Figs. 2 to 5 of the drawings wherein the circuit elements corresponding to those in Fig. 1 of the drawings have been given the same reference numeral. It will be noted that the spacer bar 49 which is of electrically conductive material such as metal is actually formed of a plurality of tubular sections for mounting and spacing the various wafer switch sections 60, 61, 62, and 63. The chassis ground 50 is provided with a vertically extending shield plate for shielding the tuned grid circuits 20 from the tuned plate circuits 30 and the spacer member 49 is electrically connected at 65 to the vertical shield portion of the chassis ground 50. The wafer switch section 62 is of insulating material and therefore the spacer member 49 is connected by a bridging wire 66 to the grounding lead 56 and one lead of the bypass condenser 55. Grounding lead 48 of the input coupling coil 46 for the "high band" resonant circuits of the television tuner is provided with an insulating sleeve 67 and passed through the wall of the chassis ground shield 50 to a point of connection 68 on the metallic spacer member 49. In actual mass production of the tuner it has been found that the indicated point of connection 68 on the spacer member provides a desirable amount of regenerative feedback for any of the mass produced tuners of this type and obtains uniform bandwidth over the high frequency channels.

In the foregoing a television tuner having regenerative feedback for the radio frequency preselector amplifier tube when tuned to a range of frequencies included in the so-called "high band" range has been described. Such regenerative feedback providing increased gain and reduced bandwidth is obtained by intercoupling the tuned grid and plate of the preselector tube circuits through the coupling provided by the stray reactance of the grounding leads of the tuned grid and plate circuits.

Although a specific structural embodiment of the invention providing a predetermined amount of regenerative feedback for the tuned grid and plate circuits has been described, it should be understood that various other arrangements providing the desired reactive coupling in the radio frequency range of 100 megacycles or higher may be employed without departing from the spirit of the invention and the intended scope of the appended claims.

I claim:

1. A radio frequency amplifier for use in television tuners of the type having resonant circuits tunable in a first range of frequencies of 54 to 88 megacycles and a second range of frequencies of 174 to 216 megacycles, including in combination, an amplifier tube having control grid and plate electrodes, said resonant circuits including a first tuned circuit for said control grid and a second tuned circuit for said plate, a chassis ground, a condenser having one terminal thereof connected to said second tuned circuit, a first input coupling circuit for said first tuned circuit and responsive to the first range of frequencies, a second input coupling circuit for said first tuned circuit and responsive to the second range of frequencies, a grounding lead connecting the other terminal of said condenser to said chassis ground, said grounding lead having reactance to radio frequency signals above 100 megacycles, said first input coupling circuit being connected directly to said chassis ground, and said second input coupling circuit being connected to said grounding lead and through said grounding lead to said chassis ground to thereby provide regenerative coupling between the plate and control grid electrodes of said tube effective to provide uniform bandwidth and high gain in the second range of frequencies.

2. A radio frequency amplifier for use in television tuners of the type having resonant circuits tunable in a first range of frequencies and a second range of substantially higher frequencies, including in combination, an amplifier tube having a control grid and plate electrodes, said resonant circuits including a first tuned circuit for said control grid and a second tuned circuit for said plate, a chassis ground, a condenser for said second tuned circuit, a first input coupling circuit for said first tuned circuit and responsive to the first range of frequencies, a second input coupling circuit for said first tuned circuit and responsive to the second range of frequencies, a grounding lead for connecting one end of said condenser to said chassis ground, said first input circuit being connected directly to the chassis ground, and said second input circuit being connected to chassis ground through said grounding lead to thereby provide regenerative coupling between the plate and control grid electrodes of said tube effective in the second range of substantially higher frequencies.

3. A radio frequency amplifier for use in television tuners of the type having switch means selectively connecting a plurality of resonant circuits tunable through a wide range of frequencies from 54 to 216 megacycles and including a pair of input coupling circuits, the first one of said input coupling circuits being connected to couple with the selected resonant circuits tunable through a first range of 54 to 88 megacycles and the second one of said input coupling circuit being connected to couple with the selected resonant circuits tunable through a second range of frequencies of 174 to 216 megacycles, the combination including an amplifier tube having control grid and plate electrodes, said switched resonant circuits including first switch tuned circuits for said control grid and second switch tuned circuits for said plate, a condenser for said second tuned circuits, a chassis ground, a gang switch for simultaneously switching the selected resonant circuits of said first and second tuned circuits, said gang switch having a spacer member of electrically conductive material, a grounding lead for connecting said spacer member to said chassis ground, said spacer member and said grounding lead having reactance to radio frequency signals above 100 megacycles, said first input coupling circuit being connected directly to said chassis ground, and said second input coupling circuit together with said condenser being connected to said spacer member and thence to chassis ground through said grounding lead to thereby provide regenerative feedback between said control grid and plate electrodes effective only for the second range of frequencies from 174 to 216 megacycles.

4. A radio frequency amplifier for use in television tuners of the type having switch means selectively connecting a plurality of resonant circuits tunable through a wide range of frequencies and including a pair of input coupling circuits, the first one of said input coupling circuits being connected to couple with selected resonant circuits tunable through a first range of frequencies and the second one of said input coupling circuits being connected to couple with selected resonant circuits tunable through a second non-contiguous range of higher frequencies above 100 megacycles, the combination including an amplifier tube having control grid and plate electrodes, said switched resonant circuits including first switch tuned circuits for said control grid and second switch tuned circuits for said plate, a condenser for said second tuned circuits, a chassis ground, a gang switch for simultaneously switching the selected resonant circuits of said first and second tuned circuits, said gang switch having a spacer member of electrically conductive material, a grounding lead for connecting said spacer member to said chassis ground, said spacer member and said grounding lead having reactance to radio frequency signals above 100 megacycles, said first input coupling circuit being connected directly to said chassis ground, and said second input coupling circuit together with said condenser being connected to said spacer member and thence to chassis ground through said grounding lead to thereby provide regenerative feedback between said control grid and plate electrodes effective only for the second range of higher frequencies.

5. A radio frequency amplifier for use in television tuners of the type having switch means selectively connecting a plurality of resonant circuits tunable through a wide range of frequencies and including a pair of input coupling circuits, the first one of said input coupling circuits being connected to couple with selected resonant circuits tunable through a first range of frequencies and the second one of said input coupling circuits being connected to couple with selected resonant circuits tunable through a second noncontiguous of higher frequencies above 100 megacycles, the combination including an amplifier tube having control grid and plate electrodes, said switched resonant circuits including first switch tuned circuits for said control grid and second switch tuned circuits for said plate, a condenser for said second tuned circuits, a chassis ground, a gang switch for simultaneously switching the selected resonant circuits of said first and second tuned circuits, said gang switch having a spacer member of electrically conductive material, a grounding lead for connecting one end of said spacer member to said chassis ground, the other end of said spacer member being connected directly to said chassis ground, said spacer member and said grounding lead having reactance to radio frequency signals above 100 megacycles, said first input coupling circuit being connected directly to said chassis ground, said second input coupling circuit being connected to said spacer member near the end of said spacer member that is connected directly to chassis ground, and said condenser being connected to said spacer member near the connection of said spacer member to said grounding lead to thereby provide a predetermined amount of regenerative feedback between said control grid and plate electrodes effective only for the second higher range of frequencies.

6. A radio frequency amplifier for use in television tuners of the type having switch means selectively connecting a plurality of resonant circuits tunable through a wide range of frequencies from 54 to 216 megacycles and including a pair of input coupling circuits, the first one of said input coupling circuits being connected to couple with the selected resonant circuits tunable through a first range of 54 to 88 megacycles and the second one of said input coupling circuits being connected to couple with the selected resonant circuits tunable through a second range of frequencies of 174 to 216 megacycles, the combination including an amplifier tube having control grid and plate electrodes, said switched resonant circuits including first switch tuned circuits for said control grid and second switch tuned circuits for said plate, a condenser for said second tuned circuits, a chassis ground, a gang switch for simultaneously switching the selected resonant circuits of said first and second tuned circuits, said gang switch having a spacer member of electrically conductive material, a grounding lead for connecting one end of said spacer member to said chassis ground, the other end of said spacer member being connected directly to said chassis ground, said spacer member and said grounding lead having reactance to radio frequency signals above 100 megacycles, said first input coupling circuit being connected directly to said chassis ground, said second input coupling circuit being connected to said spacer member near the end of said spacer member that is connected directly to chassis ground, and said condenser being connected to said spacer member near the connection to said grounding lead to thereby provide a predetermined amount of regenerative feedback between said control grid and plate electrodes effective only for the second range of frequencies from 174 to 216 megacycles.

7. A radio frequency amplifier for use in television receivers tunable in a first range of frequencies and a second range of frequencies substantially higher than said first range and including in combination, an amplifier tube having control grid and plate electrodes, first resonant circuit means connected to said control grid electrode, second resonant circuit means connected to said plate electrode, a chassis ground, and grounding lead means connected to said chassis ground having substantial impedance in said second range of frequencies, said first resonant circuit means including a first input coupling portion responsive to said first range of frequencies and a second input coupling portion responsive to said second range of frequencies, said first input coupling portion being connected directly to said chassis ground, said second input coupling portion being connected to said grounding lead means, said second resonant circuit means including a portion connected to said grounding lead means, whereby said grounding lead means provides regenerative coupling between said plate and control grid electrodes of said tube effective in said second range of frequencies.

8. A radio frequency amplifier for use in television tuners of the type having resonant circuit means tunable in a first range of frequencies and a second range of frequencies substantially higher than the first range and including in combination, an amplifier device having input and output electrodes, said resonant circuit means including first tuned circuit means for said input electrode and second tuned circuit means for said output electrode, a chassis ground, grounding lead means connected to said chassis ground and having substantial impedance in said second range of frequencies, a first input coupling circuit for said first tuned circuit means responsive to the first range of frequencies, and a second input coupling circuit for said first tuned circuit means and responsive to the second range of frequencies, said first input circuit being connected directly to said chassis ground, said second tuned circuit means including a portion connected to said grounding lead, and said second input circuit being connected to said grounding lead, to thereby provide regenerative coupling through said grounding lead between said input and output electrodes of said device effective in the second range of substantially higher frequencies.

References Cited in the file of this patent

UNITED STATES PATENTS

| Number | Name | Date |
|---|---|---|
| 2,215,796 | Rust et al. | Sept. 24, 1940 |

FOREIGN PATENTS

| Number | Country | Date |
|---|---|---|
| 222,595 | Great Britain | Oct. 9, 1924 |